(12) United States Patent
Lee et al.

(10) Patent No.: US 8,443,320 B2
(45) Date of Patent: May 14, 2013

(54) EXTRACTING METHODS FOR CIRCUIT MODELS

(75) Inventors: Meng-Jung Lee, Taoyuan County (TW); Yu-Lan Lo, Hsinchu (TW); Shu-Yi Kao, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 12 days.

(21) Appl. No.: 13/115,732

(22) Filed: May 25, 2011

(65) Prior Publication Data
US 2011/0296365 A1    Dec. 1, 2011

(30) Foreign Application Priority Data

May 25, 2010    (TW) ................................ 99116627 A

(51) Int. Cl.
*G06F 17/50*    (2006.01)
(52) U.S. Cl.
USPC ......................................................... 716/110

(58) Field of Classification Search .................. 716/100, 716/110
See application file for complete search history.

(56) References Cited

U.S. PATENT DOCUMENTS 7,019,565 B2 *   3/2006   Tam et al. ..................... 327/122
2004/0145392 A1 *   7/2004   Yoshikawa ..................... 327/108

* cited by examiner

*Primary Examiner* — Suchin Parihar
(74) *Attorney, Agent, or Firm* — McClure, Qualey & Rodack, LLP

(57) ABSTRACT

The present invention relates to an extracting method for a circuit model, configured to represent output driving capability and an input capacitor of an interface pin of an application circuit. The extracting method comprises: receiving a netlist describing a circuit structure of the application circuit, which comprises a plurality of transistors; selecting an interface pin of the application circuit in the netlist; selecting a bias pin of the application circuit in the netlist; selecting at least one path between the interface pin and the bias pin in the netlist; and obtaining sum of equivalent width/length ratios according to the width/length ratios of all first transistors coupled to the at least one path.

14 Claims, 5 Drawing Sheets

EXTRACTING METHODS FOR CIRCUIT MODELS

CROSS-REFERENCE TO RELATED APPLICATION

This non-provisional application claims priority under 35 U.S.C. §119(a) on Patent Application No. 099116627 filed in Taiwan R.O.C. on May 25, 2010, the entire contents of which are hereby incorporated by reference.

BACKGROUND OF THE INVENTION

1. Field of the Invention

The present invention relates to a circuit model extracting method, and more particularly, to a circuit model extracting method for representing output driving capability of an interface pin of an application circuit, and for representing an input capacitor of another interface pin of the application circuit.

2. Description of the Prior Arts

Generally speaking, in order to generate the liberty model of the circuit design hard block, two kinds of design information should be specified as follows: (1) the interface pin capacitance; and (2) the equivalent driving capability of the output pin.

The current processing ways for specifying the design information are divided into the following two types: (1) artificial trace: the devices, to which each pin is connected, are traced by manual operation for calculating the equivalent capacitance of the pin and tracing the equivalent driving capability of the output pin. However, this way involves much wasted time and manpower and has a high error probability of occurrence, for example, miss, error calculation, write error, etc.; and (2) simulation: the interface pin capacitance is obtained by dumping a DC simulation result to a pin capacitor of each of the pins under the single bias state. However, there is no way to ensure that the pin capacitor is at the worst case. The driving capability of the output pin is obtained by performing the transient simulation. The fixed load is first coupled to the output pin, and then the transition time of the output pin is recorded. After all buffers in a standard cell library are coupled to loads having the same value, the transition simulation is run for searching out the output transition time, and an indication is provided that the output driver is similar to the buffer if the output transition time is close to the transition time of the output pin. Although the interface pin in the prior art can obtain the approximate driving capability by performing the mentioned ways, the simulation may require a great deal of time to get the result as the complexity of the IC design increases. Furthermore, the designer needs to design one or more input patterns for obtaining the wanted result, resulting in much time consumption for preparing simulation environment.

Accordingly, in view of the above drawbacks, it is imperative that an apparatus and method are designed so as to solve the foregoing drawbacks.

SUMMARY OF THE INVENTION

In view of the disadvantages of the prior art, the primary object of the present invention is to simplify the process of obtaining driving capability and the equivalent capacitance of the application circuit via a static way without simulation. Therefore, the error portability of occurrence by artificial trace and the manpower consumption are greatly lowered, and wherein the application circuit may be an integrated circuit (IC).

According to one embodiment, one skilled in the art can provide an extracting method for a circuit model, configured to represent output driving capability of an application circuit, comprising: receiving a netlist describing a circuit structure of the application circuit, which comprises a plurality of transistors; selecting an interface pin of the application circuit in the netlist; selecting a bias pin of the application circuit in the netlist; selecting at least one path between the interface pin and the bias pin in the netlist; and obtaining sum of equivalent width/length ratios according to the width/length ratios of all first transistors coupled to the at least one path.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become readily understood from the detailed description given herein below and the accompanying drawings which are given by way of illustration only, and thus are not limitative of the present invention and wherein.

DESCRIPTION OF THE EXEMPLARY EMBODIMENTS

The following descriptions are of exemplary embodiments only, and are not intended to limit the scope, applicability, or configuration of the invention in any way. Rather, the following description provides a convenient illustration for implementing exemplary embodiments of the invention. Various changes to the described embodiments may be made in the function and arrangement of the devices described. Several exemplary embodiments cooperating with the detailed description are presented as follows.

Figure 1:
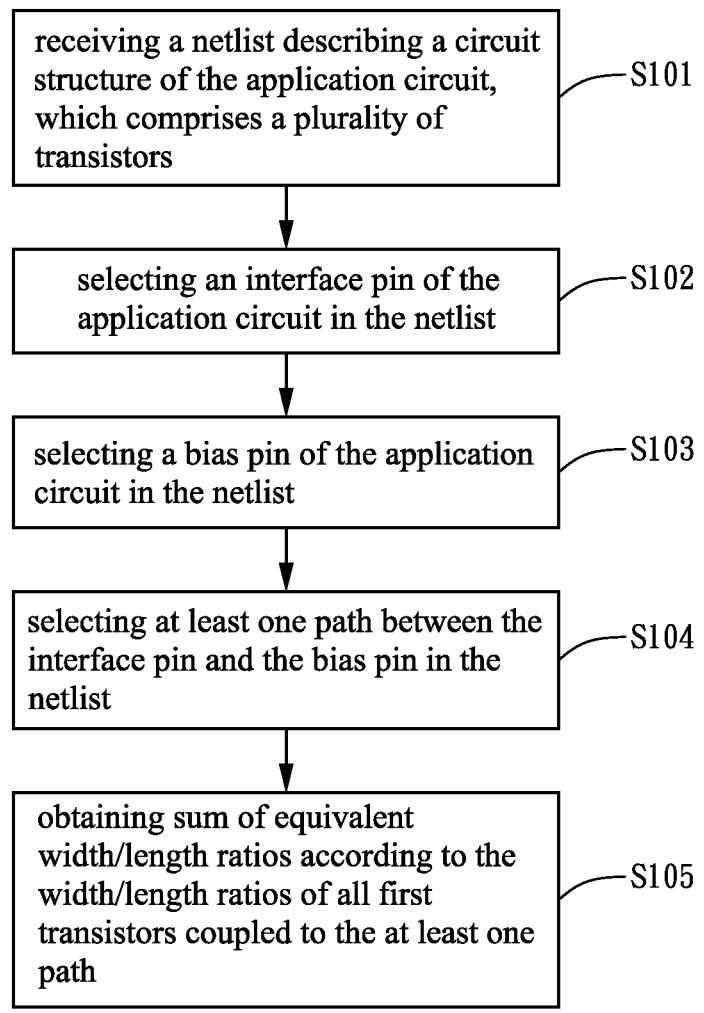
FIG. 1 illustrates one preferred embodiment of the present invention.

FIG. 1 illustrates one preferred embodiment of the present invention, which discloses an extracting method for a circuit model, configured to represent output drive capability of a application circuit and the method comprises the steps as follows:

S101: receiving a netlist described a circuit structure of the application circuit, which comprises a plurality of transistors;

S102: selecting an interface pin of the application circuit in the netlist;

S103: selecting a bias pin of the application circuit in the netlist;

S104: selecting at least one path between the interface pin and the bias pin in the netlist; and S105: obtaining sum of equivalent width/length ratios according to the width/length ratios of all first transistors coupled to the at least one path.

Preferably, the method of FIG. 1 further comprises the step of:

S106 (not shown in): selecting an equivalent transistor from a plurality of equivalent transistors in a standard cell library according the sum of equivalent width/length ratios.

Preferably, the width/length ratio of the equivalent transistor is substantially equal to/smaller than the sum of equivalent width/length ratios.

Preferably, the first transistor is a P-type transistor when the bias pin is defined as a power port.

Preferably, the first transistor is a N-type transistor when the bias pin is defined as a ground port.

According to another preferred embodiment of the present invention, a computer-readable medium for storing a computer program is disclosed. The computer program is loaded into a computer to enact the computer to execute the extracting method for the circuit model of the mentioned embodiment.

Figure 2:
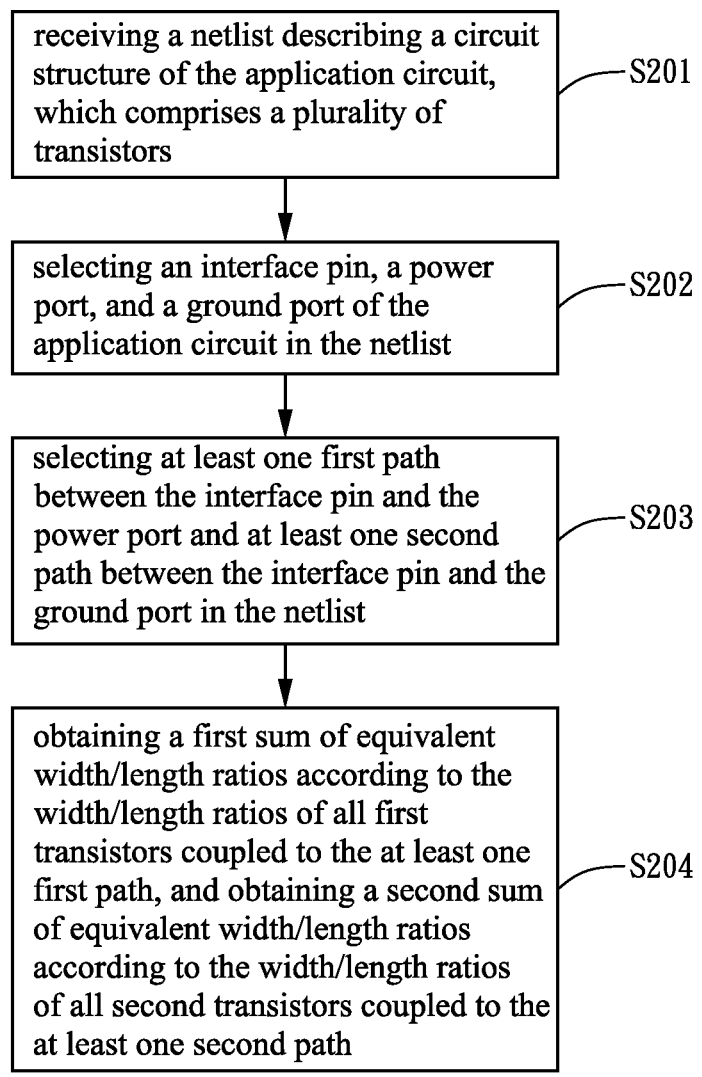
FIG. 2 illustrates another preferred embodiment of the present invention.

FIG. 2 illustrates another preferred embodiment of the present invention, which discloses an extracting method for a circuit model, configured to represent output drive capability of a application circuit and the method comprises the steps as follows:

S201: receiving a netlist describing a circuit structure of the application circuit which comprises a plurality of transistors;

S202: selecting an interface pin, a power port, and a ground port of the application circuit in the netlist;

S203: selecting at least one first path between the interface pin and the power port and at least one second path between the interface pin and the ground port in the netlist; and S204: obtaining a first sum of equivalent width/length ratios according to the width/length ratios of all first transistors coupled to the at least one first path, and obtaining a second sum of equivalent width/length ratios according to the width/length ratios of all second transistors coupled to the at least one second path.

Preferably, the method of FIG. 2 further comprises the step of:

S205(not shown in): selecting an equivalent buffer from a plurality of equivalent buffers in a standard cell library according the first and second sum of equivalent width/length ratios.

Preferably, the width/length ratios of all the first transistors in the output of the equivalent buffer are equal to/smaller than the first sum of equivalent width/length ratios.

Preferably, the width/length ratios of all the second transistors in the output of the equivalent buffer are equal to/smaller than the second sum of equivalent width/length ratios.

According to another preferred embodiment of the present invention, a computer-readable medium for storing a computer program is disclosed. The computer program is loaded into a computer to enact the computer to execute the extracting method for the circuit model of the mentioned embodiment.

Figure 3B:
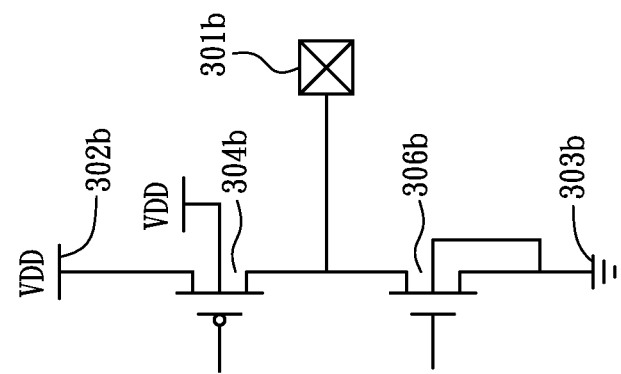
FIG. 3B illustrates an equivalent circuit of FIG. 3A.
Figure 3A:
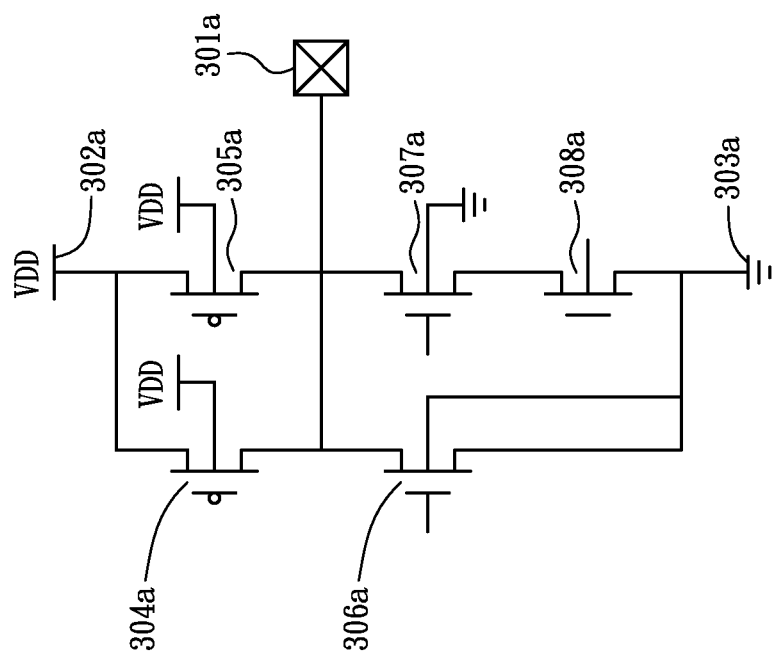
FIG. 3A further illustrates a local diagram of the embodiment of FIG. 1.

For further explaining the embodiments of FIGS. 1 and 2, please refer to FIG. 3. FIG. 3A illustrates a local diagram of the application circuit, which comprises an output pin 301a, a power port 302a and a ground port 303a. Specifically, a P-type transistor 304a and a P-type transistor 305a are located between the power port 302a and the output pin 301a, and a N-type transistor 306a and two N-type transistors 307a, 308a with cascade structure are located between the ground pin 303a and output pin 301a. Hereby, the power port and ground port are respectively defined as the bias pin.

Subsequently, FIG. 3B illustrates an equivalent circuit of FIG. 3A. The equivalent circuit comprises an output pin 301b, a bias pin 302b and a ground pin 303b. Specifically, a P-type transistor 304b is located between the bias pin 302b and output pin 301b and a N-type transistor 306b is located between the ground pin 303b and output pin 301b.

Figure 4:
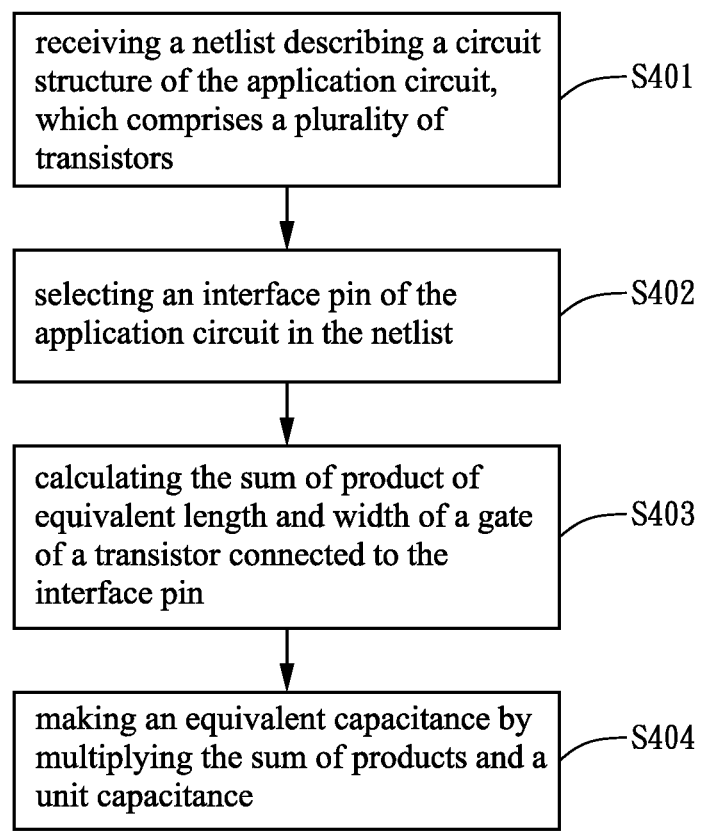
FIG. 4 illustrates another preferred embodiment of the present invention.

Meanwhile, as shown in FIG. 4, the P-type transistor 304b is equal to the P-type transistor 304a connected to the P-type transistor 305a in parallel. The equivalent width of P-type transistor 304b is equal to the sum of equivalent width of P-type transistor 304a and 305a and the equivalent length of the P-type transistor 304b is the minimum length when the P-type transistors 304a and 305a both are minimum length.

The N-type transistor 306b is equal to two N-type transistors 307a and 307b with cascade structure connected to the N-type transistor 306a in parallel.

Specifically, one of ordinary skill in the art will appreciate that the minimum lengths of the transistors are calculated according to the width/length ratio of each of the transistors whether the transistors are connected in parallel or series. The duplicate description will therefore be omitted for purposes of brevity.

Accordingly, an equivalent transistor is selected from a plurality of equivalent transistors in a standard cell library for representing P-type transistor 304b according to the equivalent width/length ratio of the P-type transistor 304b, and wherein the equivalent width/length ratio of the equivalent P-type transistor is substantially equal to or smaller than the equivalent width/length ratio of P-type transistor 304b. Similarly, an equivalent transistor is selected from a plurality of equivalent transistors in a standard cell library for representing N-type transistor 306b according to the equivalent width/length ratio of the P-type transistor 306b, and wherein the equivalent width/length ratio of the equivalent P-type transistor is substantially equal to or smaller than the equivalent width/length ratio of P-type transistor 306b.

Furthermore, an equivalent buffer is select from a plurality of equivalent buffers in a standard cell library for representing the P-type transistors 304b and N-type transistor 306b according to the equivalent width/length ratios of the P-type transistor 304b and the N-type transistor 306b, and wherein the equivalent width/length ratio of the equivalent P-type transistor in the output port of the equivalent buffer is substantially equal to/smaller than the equivalent width/length ratio of P-type transistor 304b and the equivalent width/length ratio of the equivalent N-type transistor in the output port of the equivalent buffer is substantially equal to/smaller than the equivalent width/length ratio of N-type transistor 306b.

FIG. 4 illustrates another preferred embodiment of the present invention, which discloses an extracting method for a circuit model, configured to represent input capacitor of an application circuit and the method comprises the steps as follows:

S401: receiving a netlist describing a circuit structure of the application circuit which comprises a plurality of transistors;

S402: selecting an interface pin of the application circuit in the netlist;

S403: calculating the sum of product of equivalent length and width of a gate of a transistor connected to the interface pin; and S404: making an equivalent capacitance by multiplying the sum of products and a unit capacitance.

Preferably, the step S404 of making an equivalent capacitance by multiplying the sum of products and a unit capacitance in FIG. 4 further comprises:

S405 (not shown in): obtaining the unit capacitance by using a device model of the application circuit.

Preferably, the unit capacitance is a conduction unit capacitance when the transistor is on.

Preferably, the method of FIG. 4 further comprises:

S406 (not shown in): adding up the equivalent capacitance and an interconnect capacitor of the interface pin for getting an equivalent loading capacitance.

According to another preferred embodiment of the present invention, a computer-readable medium for storing a computer program is disclosed. The computer program is loaded into a computer to enact the computer to execute the extracting method for the circuit model of the mentioned embodiment.

Figure 5:
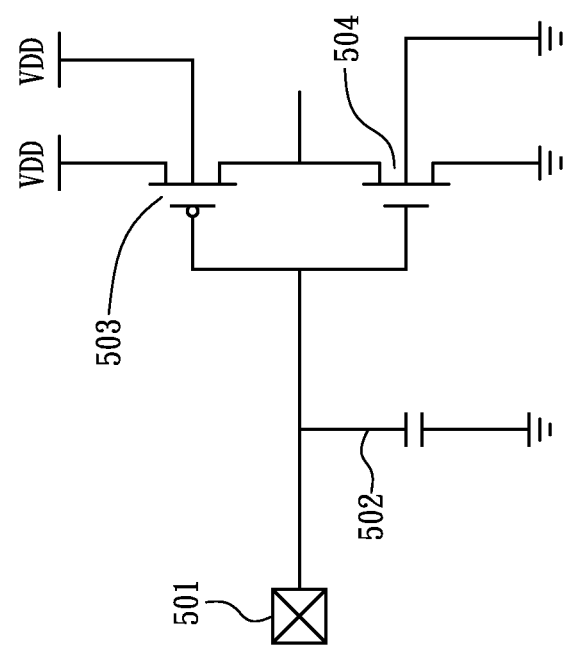
FIG. 5 illustrates another local diagram of a application circuit.

For further explaining the embodiment of FIG. 4, please refer to FIG. 5. FIG. 5 illustrates another local diagram of an application circuit, which discloses an input pin 501, an equivalent loading capacitor 502 and the devices connected to the gate of the transistor in the application circuit, for example, a P-type transistor 503 and a N-type transistor 504, and wherein the gates of the P-type transistor 503 and the N-type transistor 504 are connected to the input pin 501. Meanwhile, the gate equivalent capacitors of the P-type transistor 503 and N-type transistor 504 are made by multiplying the product of the widths and lengths of gates of the P-type transistor 503 and N-type transistor 504 and the unit capacitance of the transistor device model provided by the foundry, as shown in the extracting method for the circuit model of FIG. 5. Subsequently, an input equivalent capacitor is obtained as the sum of the gate equivalent capacitance of the P-type transistor 503 and the N-type transistor 504 and the equivalent capacitor of the equivalent loading capacitor 502. Meanwhile, the unit capacitance is a conduction unit capacitance when the transistor is on, and it does not consider the bias-variation, the present invention may the gate equivalent capacitance.

The invention being thus aforesaid, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An extracting method for a circuit model, adapted to represent output driving capability of an application circuit, comprising:
   receiving, by a computing device, a netlist describing a circuit structure of the application circuit, which comprises a plurality of transistors;
   selecting, by the computing device, an interface pin of the application circuit in the netlist;
   selecting, by the computing device, a bias pin of the application circuit in the netlist;
   selecting, by the computing device, at least one path between the interface pin and the bias pin in the netlist; and
   obtaining, by the computing device, a sum of equivalent width/length ratios according to the width/length ratios of all first transistors coupled to the at least one path.

2. The method as recited in claim 1, further comprising: selecting, by the computing device, an equivalent transistor from a plurality of equivalent transistors in a standard cell library according the sum of equivalent width/length ratios.

3. The method as recited in claim 2, wherein the width/length ratio of the equivalent transistor is substantially equal to the sum of equivalent width/length ratios.

4. The method as recited in claim 2, wherein the width/length ratio of the equivalent transistor is smaller than the sum of equivalent width/length ratios.

5. The method as recited in claim 1, wherein the first transistor is a P-type transistor when the bias pin is defined as a power port.

6. The method recited in claim 1, wherein the first transistor is a N-type transistor when the bias pin is defined as a ground port.

7. An extracting method for a circuit model, adapted to represent output driving capability of an application circuit model, comprising:
   receiving, by a computing device, a netlist describing a circuit structure of the application circuit, which comprises a plurality of transistors;
   selecting, by the computing device, an interface pin, a power port, and a ground port of the application circuit in the netlist;
   selecting, by the computing device, at least one first path between the interface pin and the power port and at least one second path between the interface pin and the ground port in the netlist; and
   obtaining, by the computing device, a first sum of equivalent width/length ratios according to the width/length ratios of all first transistors coupled to the at least one first path, and
   obtaining, by the computing device, a second sum of equivalent width/length ratios according to the width/length ratios of all second transistors coupled to the at least one second path.

8. The method recited in claim 7, further comprising: selecting, by the computing device, an equivalent buffer from a plurality of equivalent buffers in a standard cell library according the first and second sum of equivalent width/length ratios.

9. The method recited in claim 8, wherein the width/length ratios of all the first transistors in the output of the equivalent buffer are smaller than the first sum of equivalent width/length ratios.

10. The method recited in claim 1, wherein the width/length ratios of all the second transistors in the output of the equivalent buffer are smaller than the second sum of equivalent width/length ratios.

11. An extracting method for a circuit model, adapted to represent an input capacitor of an application circuit, comprising:
    receiving, by a computing device, a netlist describing a circuit structure of the application circuit, which comprises a plurality of transistors;
    selecting, by the computing device, an interface pin of the application circuit in the netlist;
    calculating, by the computing device, the sum of product of equivalent length and width of a gate of a transistor connected to the interface pin; and
    making, by the computing device, an equivalent capacitance by multiplying the sum of products and a unit capacitance.

12. The apparatus recited in claim 11, wherein the step of making an equivalent capacitance by multiplying the sum of products and a unit capacitance, further comprising: obtaining, by the computing device, the unit capacitance by using a device model of the application circuit.

13. The apparatus recited in claim 11, wherein the unit capacitance is a conduction unit capacitance when the transistor is on.

14. The method recited in claim 11, further comprising: adding, by the computing device, up the equivalent capacitance and an interconnect capacitor of the interface pin for getting a equivalent loading capacitance.

* * * * *